(12) United States Patent
Embleton et al.

(10) Patent No.: US 12,075,598 B2
(45) Date of Patent: Aug. 27, 2024

(54) SYSTEM AND METHOD FOR SERVICE LIFE MANAGEMENT BASED ON CORROSIVE MATERIAL REMOVAL

(71) Applicant: Dell Products L.P., Hopkinton, MA (US)

(72) Inventors: Steven Embleton, Austin, TX (US); Jon Taylor Fitch, Austin, TX (US); Sandor T. Farkas, Round Rock, TX (US); Joseph Danny King, Georgetown, TX (US)

(73) Assignee: DELL PRODUCTS L.P., Hopkinton, MA (US)

( * ) Notice: Subject to any disclaimer, the term of this patent is extended or adjusted under 35 U.S.C. 154(b) by 567 days.

(21) Appl. No.: 16/938,653

(22) Filed: Jul. 24, 2020

(65) Prior Publication Data
US 2022/0030743 A1    Jan. 27, 2022

(51) Int. Cl.
*H05K 7/20*        (2006.01)
*B01D 46/00*       (2022.01)
*G05B 23/02*       (2006.01)

(52) U.S. Cl.
CPC ..... *H05K 7/20181* (2013.01); *B01D 46/0036* (2013.01); *G05B 23/0283* (2013.01)

(58) Field of Classification Search
CPC ............ H05K 7/20181; B01D 46/0036; G05B 23/0283
See application file for complete search history.

(56) References Cited

U.S. PATENT DOCUMENTS

| | | | | |
|---|---|---|---|---|
| 4,140,494 A | * | 2/1979 | Coes, Jr. | C09K 3/1427 264/298 |
| 4,684,510 A | * | 8/1987 | Harkins | B01D 39/12 95/137 |
| 4,846,065 A | * | 7/1989 | Mayrhofer | B41N 1/08 101/467 |
| 5,796,580 A | | 8/1998 | Komatsu et al. | |
| 6,138,056 A | * | 10/2000 | Hardesty | G05B 19/4063 408/11 |
| 6,885,554 B1 | * | 4/2005 | Reeck | H05K 7/20572 55/385.4 |
| 10,527,537 B2 | * | 1/2020 | ter Horst | B01D 46/42 |
| 10,912,218 B1 | | 2/2021 | Cap et al. | |

(Continued)

FOREIGN PATENT DOCUMENTS

| | | | | |
|---|---|---|---|---|
| EP | 1729202 B1 | * | 11/2007 | ............... G06F 1/20 |
| WO | WO-03070355 A1 | * | 8/2003 | ......... B01D 46/0023 |

OTHER PUBLICATIONS

Fischer EP-1729202-B1 Translation.*

*Primary Examiner* — Jacob R Crum
(74) *Attorney, Agent, or Firm* — Chamberlain, Hrdlicka, White, Williams & Aughtry; Aly Z. Dossa

(57) ABSTRACT

A method for environmentally managing a computing device of an information handling system includes extracting, using a corrosive material filter, corrosive materials from an airflow that thermally manages a computing component of the computing device. The method further includes, while extracting the corrosive materials, monitoring a corrosion state of the corrosive material filter; making a determination that the corrosive material filter should be replaced based on the corrosion state; and scheduling replacement of the corrosive material filter based on the determination.

5 Claims, 8 Drawing Sheets

(56) References Cited

U.S. PATENT DOCUMENTS

| | | |
|---|---|---|
| 2001/0051276 A1* | 12/2001 | Kim .................. H05K 3/386 |
| | | 427/407.1 |
| 2006/0150599 A1* | 7/2006 | Johnson ............ B01D 39/2037 |
| | | 55/524 |
| 2007/0064390 A1* | 3/2007 | Yeh .................. H05K 7/20181 |
| | | 361/695 |
| 2008/0122081 A1 | 5/2008 | Kim et al. |
| 2011/0180421 A1 | 7/2011 | Borregaard |
| 2011/0220552 A1* | 9/2011 | Atanasova-Hoehlein .............. |
| | | C10M 175/0008 |
| | | 208/244 |
| 2012/0189425 A1 | 7/2012 | Moors et al. |
| 2013/0070409 A1 | 3/2013 | Hoss et al. |
| 2013/0265064 A1 | 10/2013 | Hamann et al. |
| 2016/0095250 A1 | 3/2016 | Shelnutt et al. |
| 2016/0160360 A1 | 6/2016 | Beaman et al. |
| 2017/0089607 A1 | 3/2017 | Vichare et al. |
| 2017/0342571 A1 | 11/2017 | Gaertner |
| 2017/0350807 A1 | 12/2017 | Minamitani |
| 2019/0257315 A1 | 8/2019 | Terraz |
| 2019/0308121 A1* | 10/2019 | Gupta ................ B01D 46/0005 |
| 2019/0310696 A1 | 10/2019 | Campbell et al. |
| 2019/0371367 A1 | 12/2019 | Asmussen et al. |
| 2020/0006256 A1 | 1/2020 | Yazzie et al. |
| 2021/0364485 A1 | 11/2021 | Fadrny et al. |
| 2022/0026969 A1 | 1/2022 | Embleton et al. |

\* cited by examiner

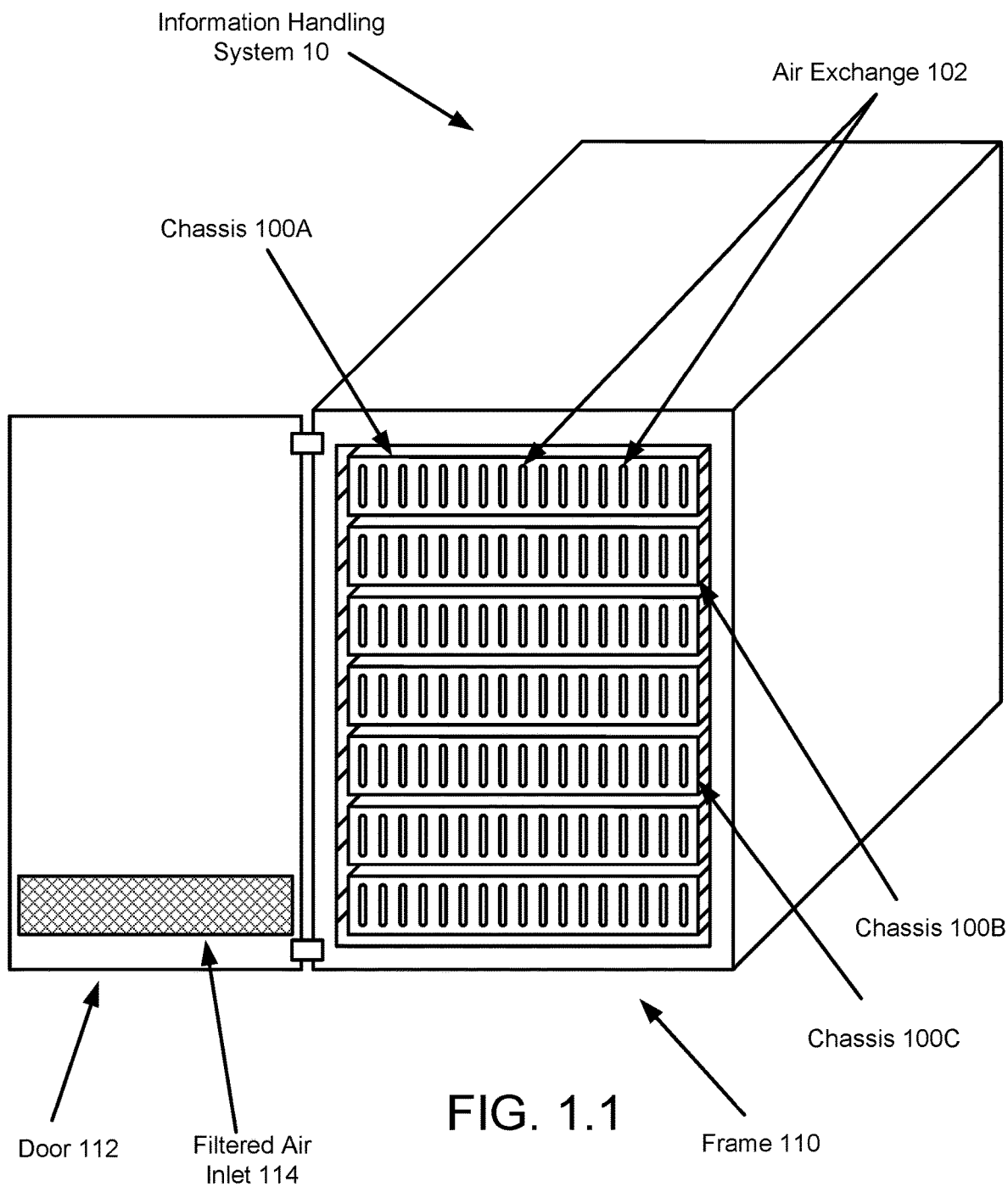
FIG. 1.1

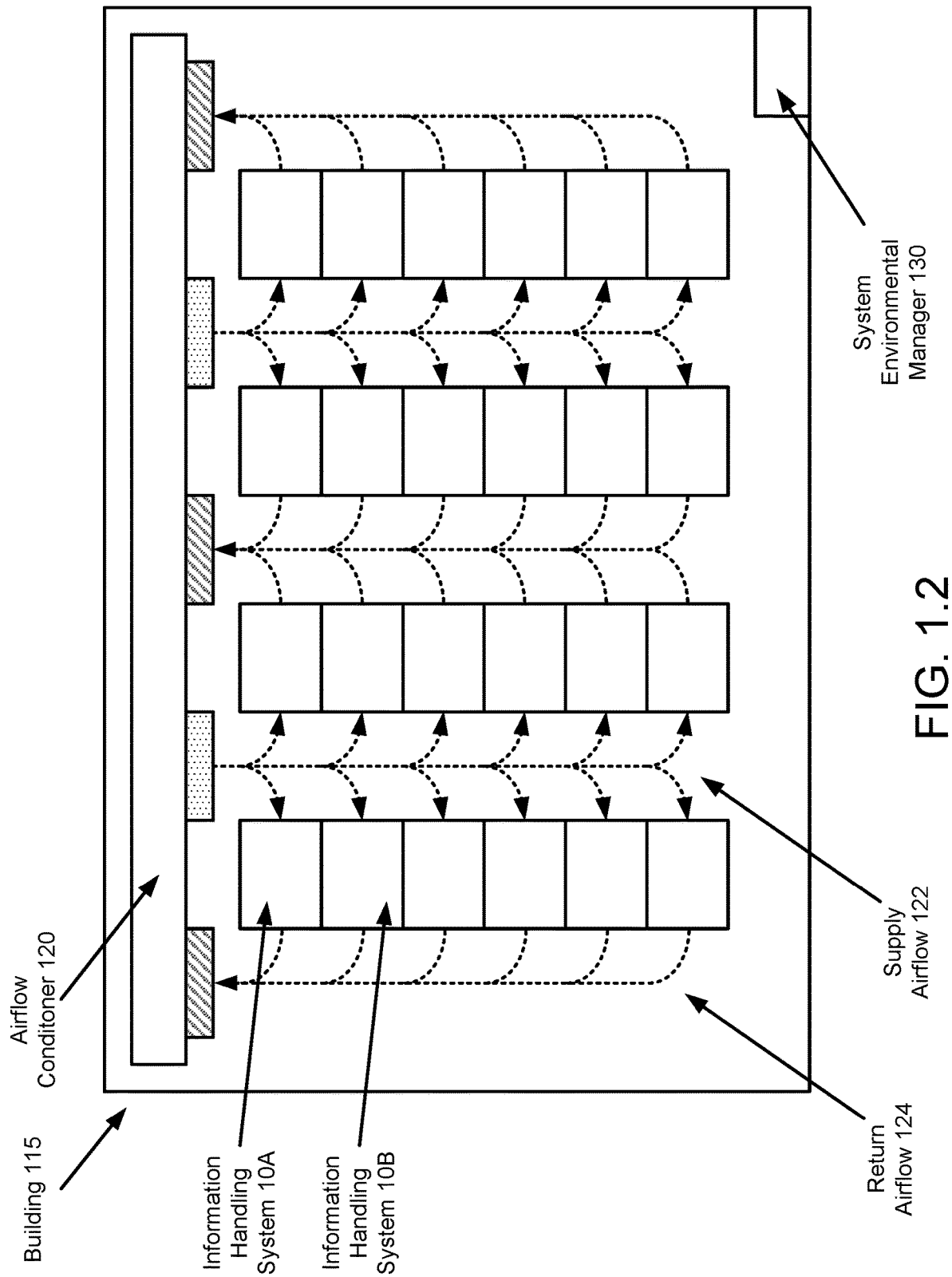
FIG. 1.2

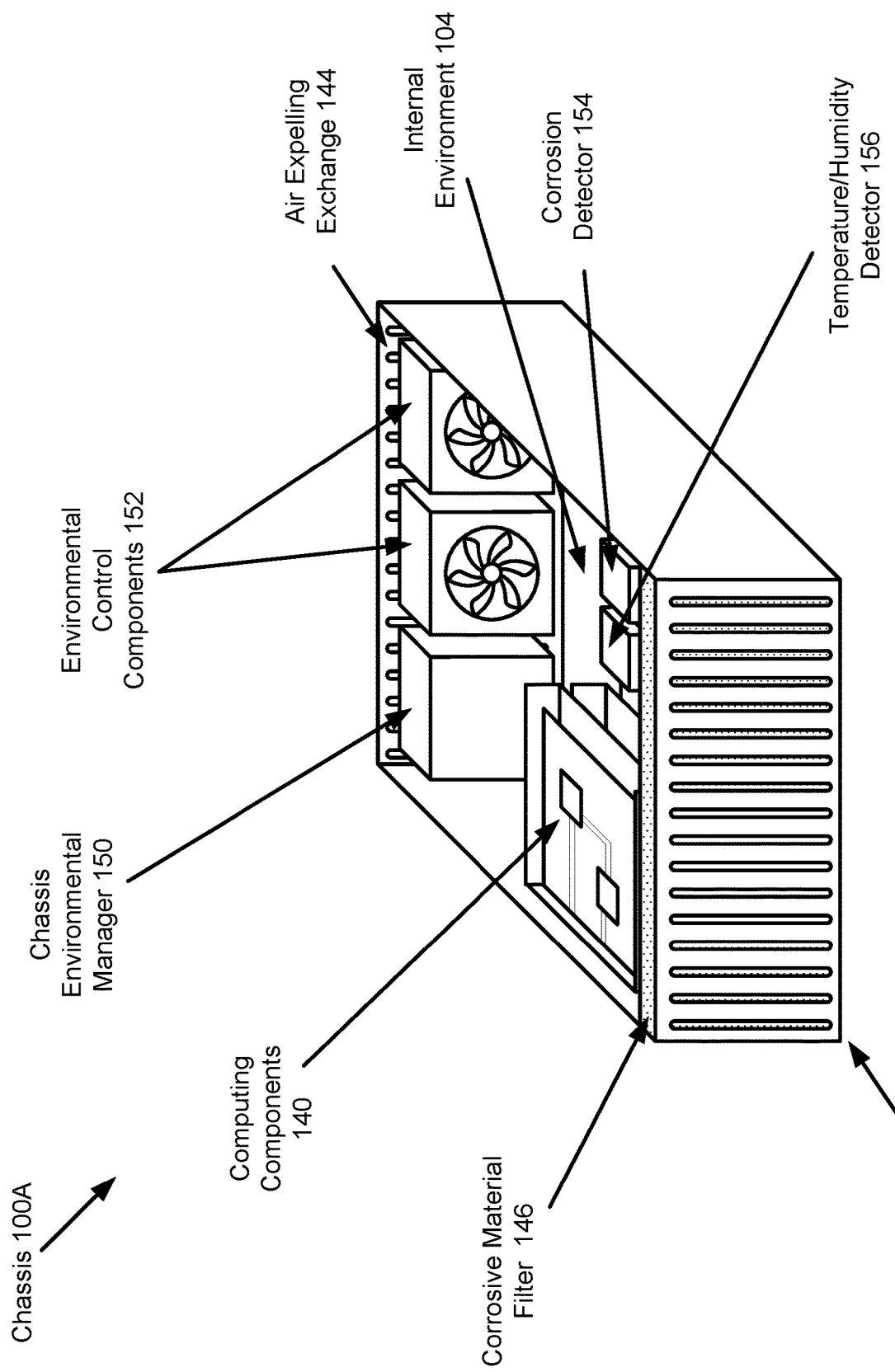
FIG. 1.3

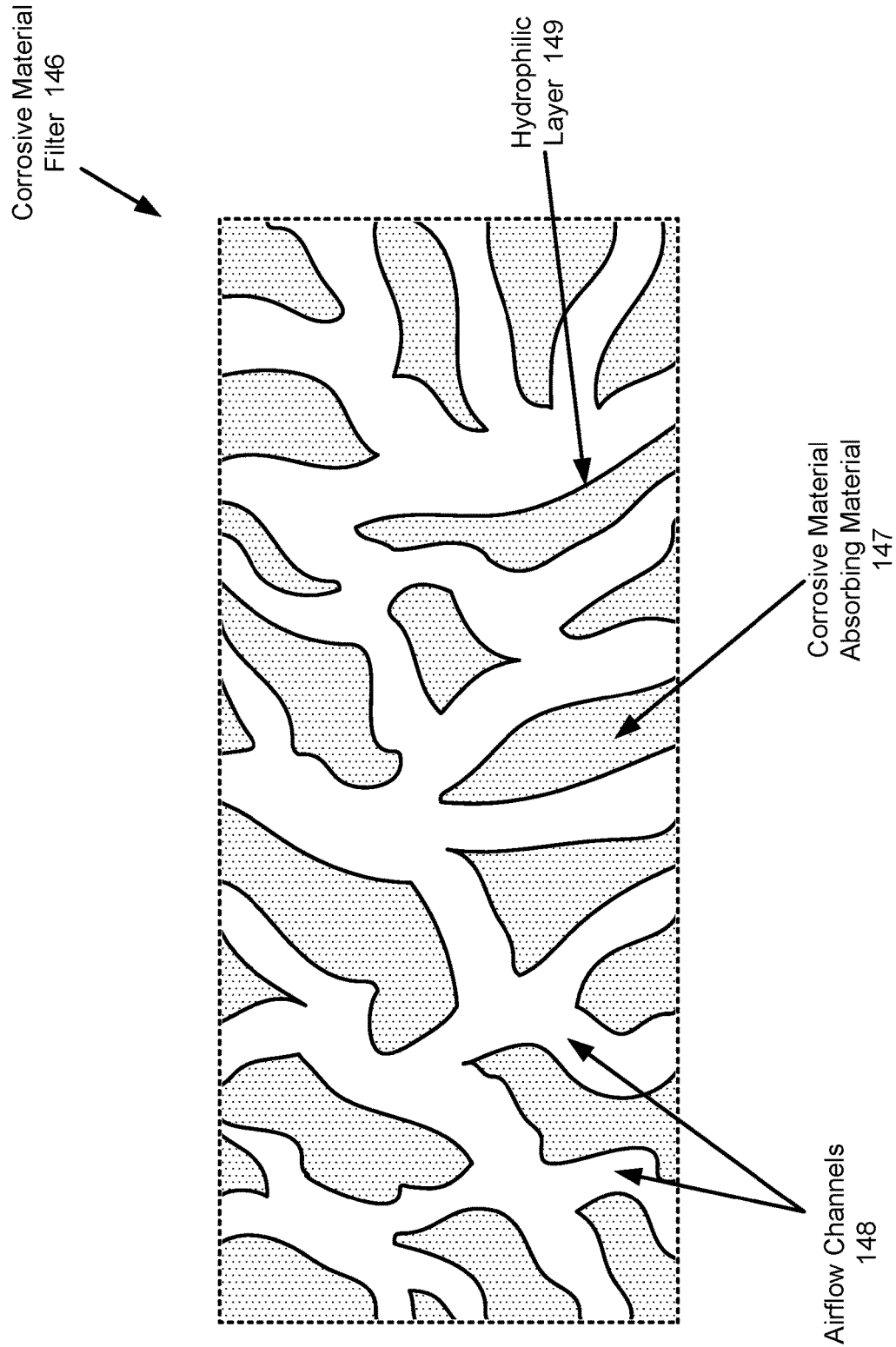
FIG. 1.4

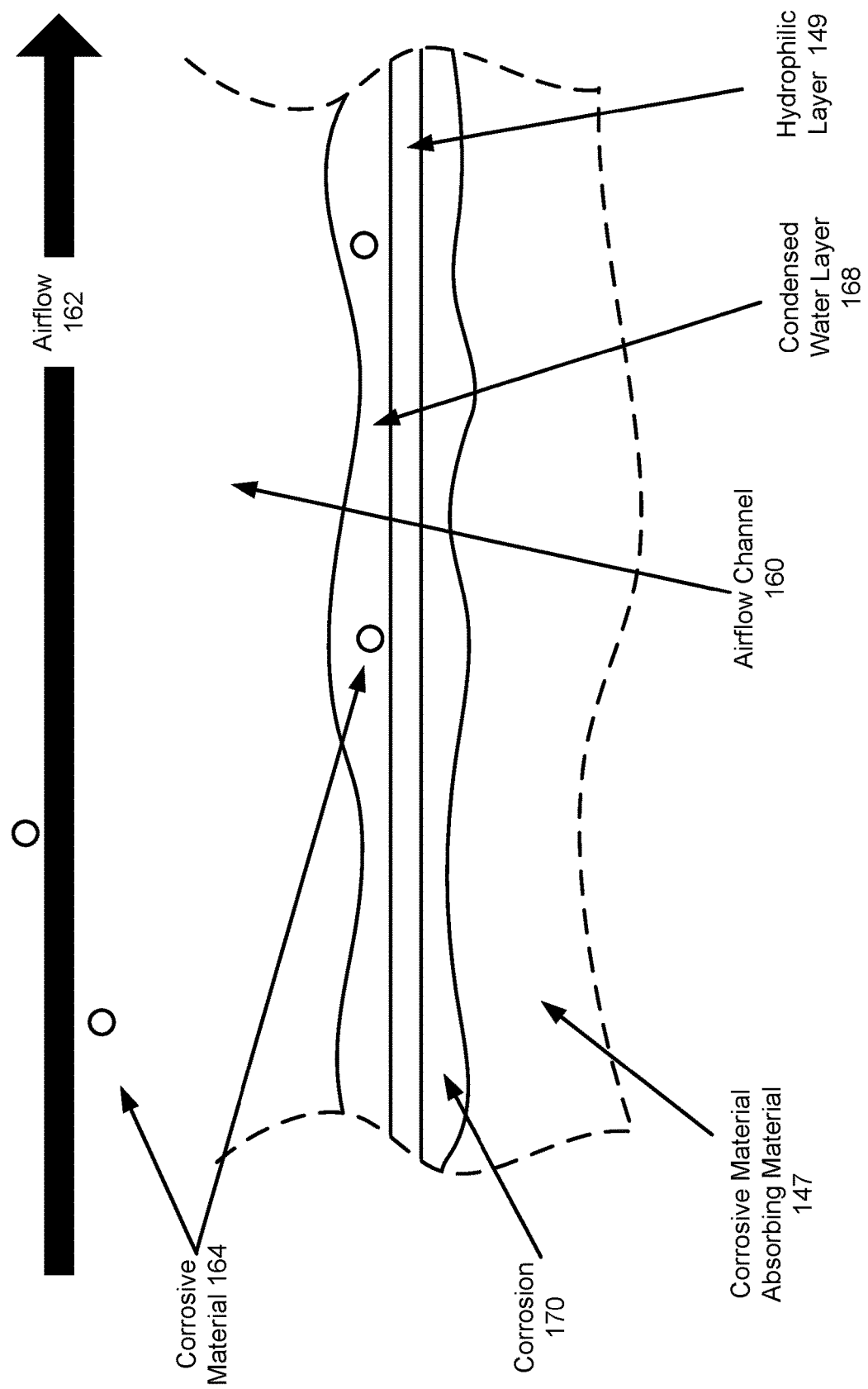
FIG. 1.5

SYSTEM AND METHOD FOR SERVICE LIFE MANAGEMENT BASED ON CORROSIVE MATERIAL REMOVAL

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, a chassis of an information handling system in accordance with one or more embodiments of the invention includes a computing component that is sensitive to corrosive materials; and a corrosive material filter adapted to extract the corrosive materials from an airflow that thermally manages the computing component.

In one aspect, a method for environmentally managing a computing device of an information handling system in accordance with one or more embodiments of the invention includes extracting, using a corrosive material filter, corrosive materials from an airflow that thermally manages a computing component of the computing device; while extracting the corrosive materials, monitoring a corrosion state of the corrosive material filter; making a determination that the corrosive material filter should be replaced based on the corrosion state; and scheduling replacement of the corrosive material filter based on the determination.

In one aspect, a non-transitory computer readable medium includes computer readable program code, which when executed by a computer processor enables the computer processor to perform a method for environmentally managing a computing device of an information handling system, the method includes extracting, using a corrosive material filter, corrosive materials from an airflow that thermally manages a computing component of the computing device; while extracting the corrosive materials, monitoring a corrosion state of the corrosive material filter; making a determination that the corrosive material filter should be replaced based on the corrosion state; and scheduling replacement of the corrosive material filter based on the determination.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of a building that includes information handling systems in accordance with one or more embodiments of the invention.

FIG. 1.3 shows a diagram of a chassis of an information handling systems in accordance with one or more embodiments of the invention.

FIG. 1.4 shows a cross section view diagram of a corrosive material filter in accordance with one or more embodiments of the invention.

FIG. 1.5 shows a diagram of a surface of a corrosive material management material in accordance with one or more embodiments of the invention.

DETAILED DESCRIPTION

Figure 2:
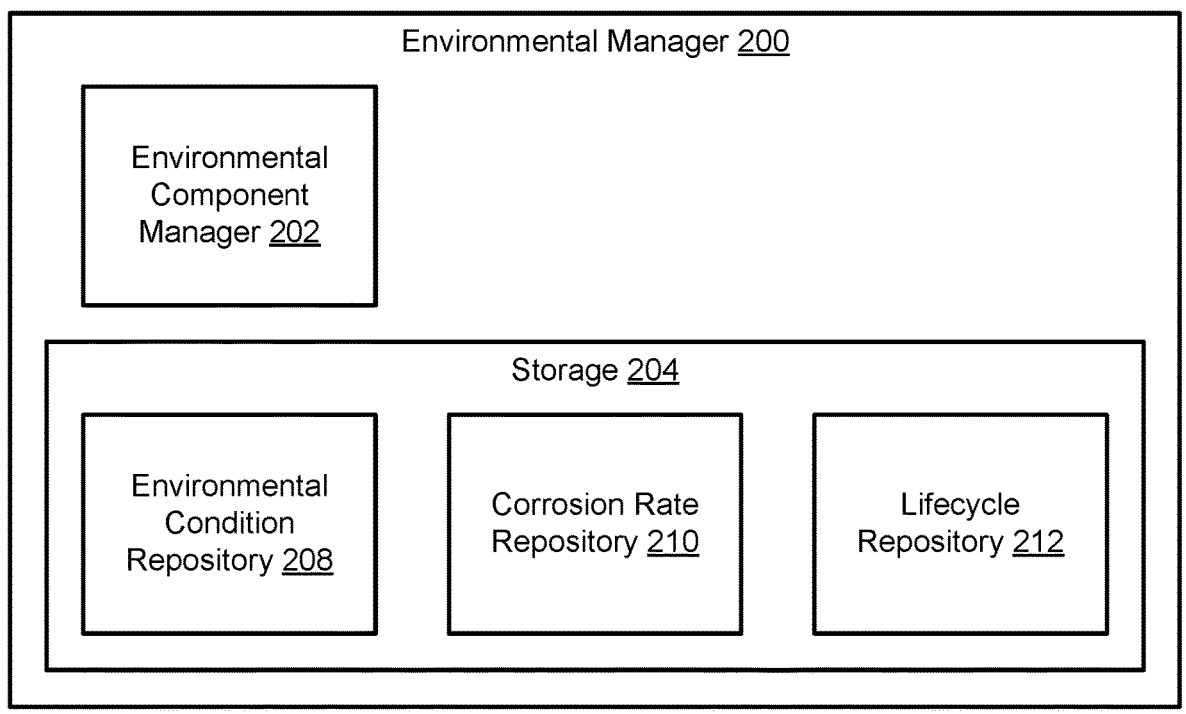
FIG. 2 shows a diagram of an environmental manager of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may generate heat and require gas flows to maintain the temperatures of these components within nominal ranges. However, these gases may cause corrosion. The corrosion may damage the corroded components. The damage may cause the components to fail and/or cause information handling system utilizing the components to fail.

Embodiments of the invention may provide methods and systems that manage corrosion. To manage corrosion, corrosive materials (e.g., chlorinated gases or other compounds that may react) included in gases used for thermal management purposes may be filtered. By filtering the corrosive materials from the gases, the rates of corrosion of components thermally managed using the gases may be reduced. Consequently, the components may be more likely to meet their service life goals.

The corrosion materials may be filtered using a corrosion material filter. The corrosive material filter may be disposed at an entrance to a chassis through which airflows used to thermal management purposes traverse. The corrosion material filter may be serviceable. For example, all or a portion of the corrosive filter material filter may be replaceable. By replacing all or a portion of a corrosion material filter, the ability of the corrosive material filter to filter corrosion may be replenished. To facilitate serviceability, corrosion material filters may be strategically disposed at a location that provides for physical access to the corrosion management filters.

The filter may provide an indication of its current ability to filter corrosion materials. For example, the corrosive material filter may chemically react when filtering corrosive materials. Consequently, a corrosive material filter may have a finite quantity of ability to filter corrosive materials. The corrosive material filter may change, for example, its visual appearance as it filters corrosive material. The change in visual appearance may correspond to its current ability to filter materials (e.g., change from a lighter to darker hue of a color as the corrosive material filter's capacity to filter corrosive materials is reduced).

By doing so, a system in accordance with embodiments of the invention may be less likely to prematurely fail or otherwise enter an undesirable corrosion state due to corrosion, be able to accept a wider range of gas compositions that may be more likely to cause corrosion without negatively impacting the system, and/or may be less costly to operate by reducing the necessary level of conditioning of gases taken into chassis of information handling systems for thermal management purposes.

FIG. 1.1 shows an information handling system (10) in accordance with one or more embodiments of the invention. The system may include a frame (110) and any number of chassis (e.g., 100A, 100B, 100C).

The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis. By managing the chassis, the frame (110) may enable multiple chassis to be densely packed in space without negatively impacting the operation of the information handling system (10).

The frame may include a door (112). The door may include a filtered air inlet (114) that enables gases to traverse into the interior of the frame (110). As will be discussed in greater detail below, the filtered air inlet (114) may reduce the quantity of corrosive materials in gases that pass through it. Consequently, corrosion or other products generated inside of the frame (110) may be reduced by virtue of reduced quantities of corrosive materials being included in the gases.

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, buildup of heat within a chassis may cause temperatures of the components disposed within the chassis to exceed preferred ranges.

The preferred ranges may include a nominal range in which the components respectively operate: (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include air exchanges (e.g., 102). An air exchange may be one or more openings in an exterior of a chassis that enables the chassis to exchange gases with an ambient environment. For example, a chassis may utilize air exchanges to (i) vent hot gases and (ii) intake cool gases. By doing so, the temperature of the gases within the chassis may be reduced. Consequently, the temperatures of components within the chassis may be reduced by utilizing the cooler gases taken into the chassis via an air exchange.

However, utilizing gases to cool components within a chassis may be problematic. The gases may not be benign, as noted above with respect to the filtered air inlet (114). For example, the gases may be: (i) chemically reactive, (ii) include humidity, and/or (iii) otherwise interact with portions of the chassis and/or components disposed within the chassis in an undesirable manner. The reaction between the gases used to cool the components, portions of the chassis, and the components themselves (or other components proximate to the to-be-cooled components) may negatively impact the components disposed within the chassis and/or the chassis.

For example, if the gases include a chemically reactive component (e.g., chlorine species), the gases may react (i.e., chemically react) with portions of the chassis and/or components disposed within the chassis. These reactions may: (i) generate corrosion on the portions of the chassis and/or (ii) generate corrosion on the components disposed within the chasses. This corrosion may (a) negatively impact the appearance of the chassis, (b) cause corrosion from the chassis to circulate within the chassis thereby potentially impacting the operation of components within the chassis, and/or (c) damage portions of the components disposed within the chassis directly resulting in a decreased service life of the components.

In another example, if the gases include humidity, the humidity may (under certain conditions) condense resulting in water (even at low levels) being disposed on the surfaces of the chassis and/or components. For example, when gases are taken into the chassis via an air exchange (102), water vapor may condense onto the surface of the air exchange.

When water is disposed on the surface of the chassis and/or components (even at very small levels), the water may chemically react forming corrosion, albeit at a much reduced rate when compared to chemically reactive species. The aforementioned reactions with the condensed water may damage the chassis, generate corrosion products that may circulate throughout the chassis, and/or damage the components or otherwise cause them to operate in an undesirable manner. Compounding corrosion due to condensed humidity and chemically reactive species may be particularly problematic because a condensed layer of water on the components or chassis may preferentially absorb chemically reactive species which may amplify the corrosive impact of the chemically reactive species.

The potential reactions, discussed above, may cause numerous negative impacts. First, the reactions may impact the appearance of the chassis. The reaction products may have an unsightly appearance that makes the chassis look impaired to a viewer. Second, the reaction products may not be fixedly attached thereby resulting in reaction products circulating throughout the interior of the chassis. These products may be deposited in unpredictable manners throughout the chassis. When deposited, the reaction products may cause, for example, short circuits, changes in impedance of circuits, or otherwise impact the ability of other components to perform their functionalities.

Third, the reactions may impact the physical size of various components disposed within the chassis. For example, when metals chemically react, the products formed by the reactions may occupy significantly larger volumes than the unreacted metals (e.g., metal oxides vs elemental metals). The change in volumes of the reacted metals may negatively impact the electrical functionality of the components by, for example, forming open circuits by physically disconnecting various portions of the components from each other and/or other devices.

The potential reactions may cause other negative impacts beyond those discussed herein. The negative impacts may cause a device to fail prior to meeting its service life. A service life may be a desired duration of operation of a component, device, or system.

To address the above and/or other potential issues, embodiments of the invention may provide methods, devices, and systems that mitigate corrosion. To mitigate corrosion, corrosive material filters may be used. A corrosive material filter may be a structure that filters out corrosive materials from airflows of gases.

The corrosive material filters may be disposed at entrances to frames (e.g., filtered air inlets (e.g., 114) and/or air exchanges (e.g., 102) of chassis. These filters may remove chemically reactive species from airflow. By doing so, the rates of corrosion of chassis and/or components disposed within chassis may be reduced.

For additional details regarding corrosive material filters, refer to FIGS. 1.3-1.5.

To facilitate corrosion management using corrosive material filters, a system in accordance with embodiments of the invention may manage the environments of chassis and frames based on corrosion risk. For example, a system may monitor the environmental conditions and/or rates of corrosion that are occurring to determine if a risk of corrosion exists. For example, corrosive materials may only be capable of absorbing a predetermined amount of corrosive materials. Consequently, the corrosive material filters may need to be replaced to maintain low rates of corrosion of components disposed inside of frames, chassis, and of chassis themselves.

If the risk of corrosion is sufficiently high, even when corrosive material filters are utilized, the system may automatically take steps to reduce the risk of corrosion. For example, the system may schedule replacement of corrosive material filters or modify environmental conditions within a frame to reduce corrosion. However, modifying environmental conditions may utilize energy. Consequently, the system may preferentially avoid consuming energy for environmental management purposes if the risk of corrosion can be managed using corrosive material filters.

Figure 3:
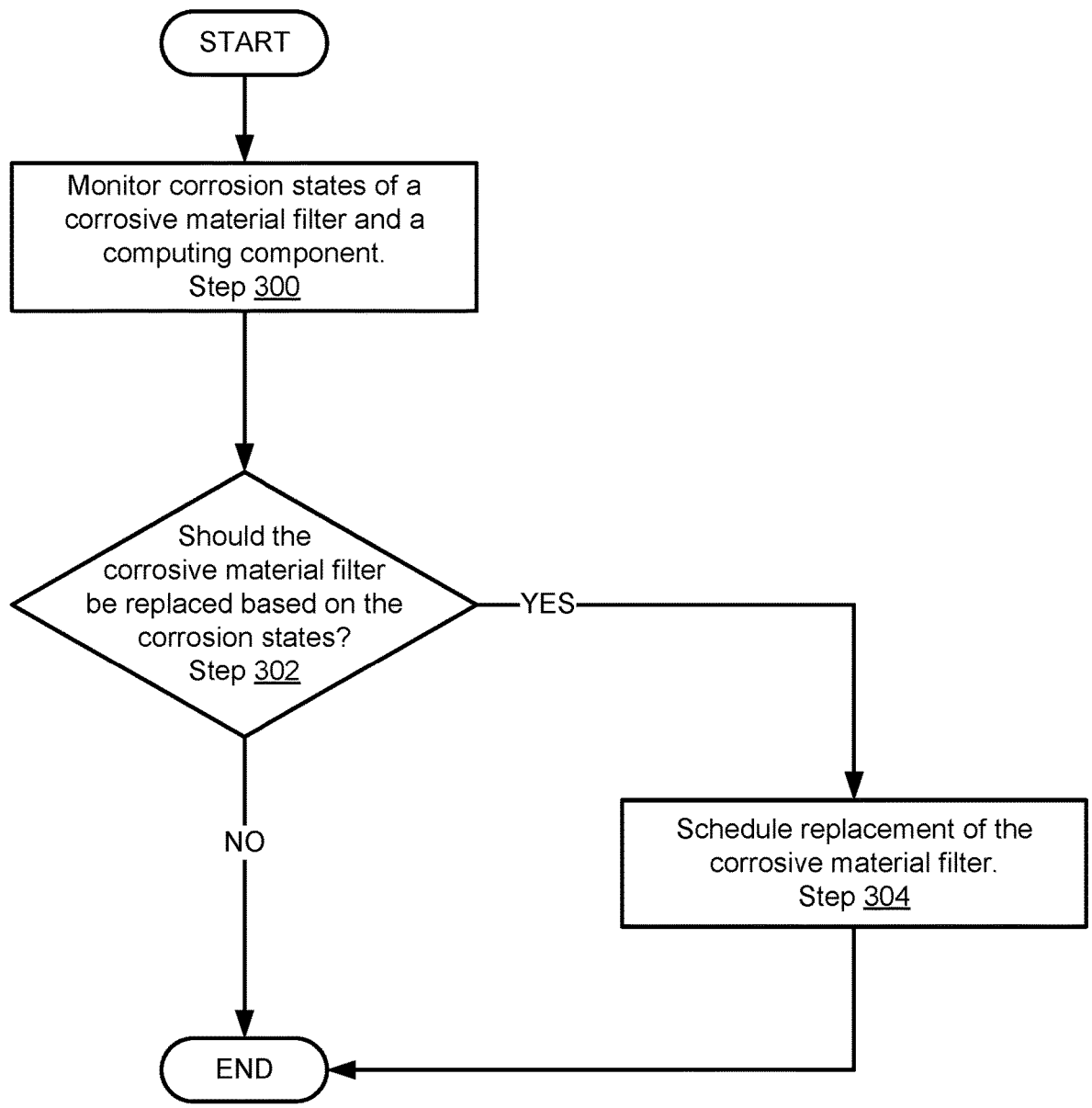
FIG. 3 shows a flowchart of a method of managing corrosion states in accordance with one or more embodiments of the invention.

For additional details regarding corrosive material filter management and environment management, refer to FIGS. 2-3.

To further clarify the environments in which corrosion may arise, a diagram of an environment in which chassis of IHSs may reside is illustrated in FIG. 1.2 and a diagram of a chassis is provided in FIG. 1.3.

Turning to FIG. 1.2, FIG. 1.2 shows a top view diagram of a building (115) in which chassis of IHSs may reside in accordance with one or more embodiments of the invention. The building (115) may house a data center (e.g., an aggregation of information handling systems) that includes any number of information handling systems (e.g., 10A, 10B). The information handling systems may include chassis which may need to take in and exhaust gases for temperature regulation purposes due to heat generation by components disposed in the chassis.

To facilitate gas management within the building (115), the information handling systems may be organized into rows (or other groupings of information handling systems). In FIG. 1.2, the rows of information handling systems extend from top to bottom along the page. To enable gases to be provided to the information handling systems (e.g., for temperature regulation purposes), an airflow conditioner (120) may be disposed within the building. The airflow conditioner (120) may provide supply airflow (122) and take in a return airflow (124). These airflows are illustrated as arrows having dashed tails.

The supply airflow (122) may be at a lower temperature than the return airflow (124). Consequently, when information handling systems obtain portions of the supply airflow (122), the information handling systems may be able to utilize the supply airflow (122) to cool components disposed within the chassis of the information handling systems. For example, gases from the supply airflow (122) may be passed by components disposed within chassis of information handling systems that are at elevated temperatures. The gases may be at a lower temperature than the components. Consequently, thermal exchange between the gases and the components may decrease the temperature of the components.

After utilizing the gases from the supply airflow (122), the information handling systems may exhaust the gases as the return airflow (124). After being exhausted from the information handling systems, the return airflow (124) may be obtained by the airflow conditioner (120), cooled, and recirculated as the supply airflow (122).

In addition to cooling the return airflow (124), the airflow conditioner (120) may be capable of obtaining gases from other areas (e.g., outside of the building), reducing the humidity level of an airflow, and/or otherwise conditioning gases for use by information handling systems and/or other devices.

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the airflow conditioner (120). By doing so, the system environmental manager (130) may cause the airflow conditioner (120) to provide gases to the information handling systems having a temperature and/or humidity level that may better enable the information handling systems to regulate their respective environmental conditions within the chassis of the respective information handling systems. However, conditioning the supply airflow (122) may utilize large amounts of energy.

The airflow conditioner (120) may include functionality to granularly, or at a macro level, modify the temperature and/or humidity level of the supply airflow (122). Consequently, different information handling systems (or groups thereof) may receive different supply airflows (e.g., 122) having different characteristics (e.g., different temperatures and/or humidity levels, different sources, etc.).

Conditioning the return airflow (124) or gases obtained from outside of the building (115) may be costly, consume large amounts of electricity, or may otherwise be undesirable. To reduce these costs, the system environmental manager (130) may set the operating point (e.g., desired temperature/humidity levels of different portions of the supply airflow (122)) of the airflow conditioner (120) to only provide the minimum necessary characteristics required by each of the IHSs so that it meets is service life goals. By doing so, the cost of providing the supply airflow (122) having characteristics required to meet the environmental requirements of the chassis of the information handling systems may be reduced.

To decide how to set the operating points of the airflow conditioner (120), the system environmental manager (130) may obtain and/or be provided information regarding the environmental conditions (e.g., temperatures, relative humidity levels, corrosion rates of components) within each of the chassis. For example, the system environmental manager (130) may be operably connected to environmental managers of each of the chassis and/or the airflow conditioner (120) via any combination of wired and/or wireless networks. The respective environmental managers of the chassis may provide such information to the system environmental manager (130) and/or service requests regarding the operating points of the airflow conditioner (120) via the operable connections.

The system environmental manager (130) may be implemented using a computing device. For additional details regarding computing devices, refer to FIG. 4. The system environmental manager (130) may perform all, or a portion, of the method illustrated in FIG. 3 while providing its functionality.

Turning to FIG. 1.3, FIG. 1.3 shows a diagram of a chassis (100A) in accordance with one or more embodiments of the invention. A chassis may be a portion of an IHS and/or house all, or a portion, of an IHS. An information handling system may include a computing device that provides any number of services (e.g., computing implemented services). To provide services, the computing device may utilize computing resources provided by computing components (140). The computing components (140) may include, for example, processors, memory modules, storage devices, special purpose hardware, and/or other types of physical components that contribute to the operation of the computing device. For additional details regarding computing devices, refer to FIG. 4.

Because the computing device uses computing components (140) to provide services, the ability of the computing device to provide services is limited based on the number and/or quantity of computing devices that may be disposed within the chassis. For example, by adding additional processors, memory modules, and/or special purpose hardware devices, the computing device may be provided with additional computing resources which it may be used to provide services. Consequently, large number of computing components that each, respectively, generate heat may be disposed within the chassis.

To maintain the temperatures of the computing components (140) (and/or other types of components) within a nominal range, gases may be taken in through an air receiving exchange (142). The gases may be passed by the computing components (140) to exchange heat with them. The heated gases may then be expelled out of an air expelling exchange (144).

However, by taking in and expelling gases used for cooling purposes, the air receiving exchange (142), other portions of the chassis (100A) and/or components disposed within the chassis (100A) may be subject to degradation due to corrosion. For example, as discussed above, the gases may include components such as humidity or chemical species that may chemically react forming corrosion. Importantly, the combination of humidity that may condense on components and chemically reactive species that may be absorbed into the condensed humidity may be particularly problematic due.

The chemical reaction products may form corrosion, cause corrosion products to circulate in the chassis (and/or outside of the chassis by being expelled as part of heated gases), and/or damage the structure and/or change the electrical properties of the computing components (140). These changes may negatively impact the ability of the computing device disposed in the chassis (100A) to provide its functionality.

For example, the computing device may have a service life during which it is expected that the computing device will be likely to provide its functionality. However, changes in the structure and/or electrical properties of these components due to exposure to humidity and/or chemically reactive specifies of the gases used for temperature regulation purposes may cause the components to prematurely fail ahead of the service life being met due to corrosion formation, change an appearance of the chassis by virtue of the presence of corrosion products, and/or otherwise negatively impact the chassis (100A) and/or components disposed within it.

In general, embodiments of the invention provide methods, devices, and systems for managing corrosion within chassis. To manage corrosion, a system in accordance with embodiments of the invention may: (i) reduce the quantity of corrosive materials used for thermal management of internal environments (e.g., 104) of chassis by utilizing corrosive material filters (e.g., 146), (ii) monitor the occurrence of corrosion (e.g., a corrosion state), and (iii) based on the corrosion, modify the internal environment of a chassis and/or initiate replacement of corrosive material filters.

By doing so, embodiments of the invention may reduce the corrosion of chassis and/or components within chassis while limiting power consumption for gas conditioning purposes. By doing so, the computing devices disposed within chassis (e.g., 100A) may be more likely to meet their respective service life goals, have lower operation costs, and/or require fewer repairs during their respective service lives.

For additional details regarding corrosive material filters (e.g., 146), refer to FIGS. 1.4-1.5.

To manage the internal environment (104) of the chassis, the chassis (100A) may include a chassis environmental manager (150). The chassis environmental manager (150) may provide environmental management services. Environmental management services may include: (i) obtaining information regarding the rates of corrosion of the chassis, corrosive material filters, and/or component within chassis, (ii) determining, based on the corrosion rates, whether service life goals are likely to be impacted by the corrosion, (iii) initiating replacement of corrosive material filters when the monitoring indicates that the corrosive material filters are unable to continue filtering corrosive materials, and/or (iv) modifying the operation (e.g., modifying operating points) of environmental control components (152) to reduce corrosion and/or reduce the amount of power consumed for environmental management purposes. For additional details regarding the chassis environmental manager (150), refer to FIG. 2.

While illustrated in FIG. 1.3 as a physical structure, as will be discussed with respect to FIG. 2, the chassis environmental manager (150) may be implemented as a logical entity (e.g., a program executing using the computing components (140)). For example, a computing device disposed in the chassis (or other locations) may host an application (e.g., executable computer instructions being executed by a processor) that provides the functionality of the chassis environmental manager (150).

To enable the chassis environmental manager (150) to provide its functionality, the chassis (100A) may include one or more detectors (e.g., 154, 156). These detectors may enable the rates of corrosion of various components (e.g., portions of the chassis, computing components, etc.) to be determined and/or environmental conditions within and/or proximate to the chassis to be determined. These detectors may be implemented as sensors or other types of physical devices that are operably connected to the chassis environmental manager (150). Any number of corrosion detectors (e.g., 154), temperature detectors (e.g., 156), humidity detectors (e.g., 156), and/or other types of detectors may be disposed at any number of locations throughout the chassis (100A).

In some embodiments of the invention, the functionality of a temperature detector may be provided by, in all or in part, the computing components (140). For example, the computing components (140) may include functionality to report their respective temperatures and/or temperatures of the internal environment (104) of the chassis (100A).

The chassis (100A) may also include environmental control components (152). The environmental control components (152) may include physical devices that include functionality to modify characteristics (e.g., temperature, humidity level, airflow rates/directions) of the internal environment (104) of the chassis (100A). The chassis (100A) may include any number of environmental control components disposed at any number of locations within the chassis.

For example, the environmental control components (152) may include gas movers such as fans. The fans may be able to modify the rate of gases being taken into and expelled from the chassis (100A) through the air exchangers (e.g., 142, 144). The rate of intake and exhaust of gases may cause an airflow to be generated within the internal environment (104). The airflow may be used to modify the rate of thermal exchange between the computing components (140) and the internal environment (104) (e.g., an environment proximate to the computing components (140)).

In another example, the environmental control components (152) may include heaters. The heaters may be able to modify the temperature of the internal environment (104). For example, heaters may be disposed at a front of the chassis (e.g., where gases are taken into the chassis) and/or about different locations within the chassis. These heaters may be used to generally and/or locally heat the internal environment (104). By doing so, the relative humidity level and temperature of the internal environment (104) proximate to the computing components (140) and/or different components may be controlled. The temperature and/or relative humidity level may be utilized to limit, reduce, or otherwise control corrosion rates of the computing components (140). For example, the rate of corrosion of components within the chassis may be dependent on the relative humidity level of the internal environment (104).

In a still further example, the environmental control components (152) may include components that are not disposed in the chassis (not shown). For example, the environmental control components may include an airflow conditioner discussed with respect to FIG. 1.2. These external components may be used in conjunction with the environment control components disposed within the chassis to manage the temperature and/or relative humidity levels throughout the internal environment (104) of the chassis as well as those of gases as they are taken into and/or expelled by the chassis (100A).

The chassis (100A) may include any number and type of environmental control components without departing from the invention. Any of the environmental control components may be implemented using physical devices operably connected to and/or controllable by the chassis environmental manager (150) and/or a system environmental manager (e.g., 130, FIG. 1.2) (alone or in combination). Any number of chassis environmental managers and system environmental managers may cooperatively operate to control the temperature and/or relative humidity levels to control the rate of corrosion occurring within the chassis and/or manage the thermal load generated by the computing components (140) and/or other components.

To cooperatively operate, the chassis environmental managers and system environmental managers may be operably connected to each another (e.g., via wired and/or wireless networks). The aforementioned components may share information with one another (e.g., detector data, operating set points of different environmental control components, etc.). These components may implement any type of model for controlling and/or delegating control of the system for temperature, relative humidity level, and/or corrosion rate management purposes. When providing their respective functionalities, these components may perform all, or a portion, of the method illustrated in FIG. 3. Any of these components may be implemented using a computing device. For additional details regarding computing devices, refer to FIG. 4.

While the chassis (100A) of FIG. 1.3 has been illustrated as including a limited number of specific components, a chassis in accordance with one or more embodiments of the invention may include additional, fewer, and/or different components without departing from the invention. Additionally, while the chassis (100A) is illustrated as having a specific form factor (e.g., rack mount), a chassis in accordance with embodiments of the invention may have different form factors without departing from the invention.

As discussed above, the chassis (100A) may include one or more corrosive material filters (e.g., disposed where gases enter a chassis, proximate to corrosion sensitive components, etc.). Additionally, corrosive material filters may be used to filter air entering a frame, as discussed with respect to FIG. 1.1. The corrosive material filters may be used to reduce the quantity of corrosive materials in gases. Consequently, components exposed to the gases may corrode at reduced rates when compared to gases that have not been filtered.

To further clarify corrosive material filters, FIGS. 1.4-1.5 show diagrams of corrosive material filters in accordance with one or more embodiments of the invention.

Turning to FIG. 1.4, FIG. 1.4 shows a diagram of a portion of a corrosive material filter (146). A corrosive material filter may include a block of material. The block of material may be formed into any shape. The block of material may enable gases to be passed through it. The block of material may reduce the quantity of corrosive materials in gases when passed through it.

To reduce the quantity of corrosive materials, the corrosive material filter (146) may react with the corrosive materials. The reaction products may be retained in the corrosive material filter (146).

In FIG. 1.4, only a portion of a cross section of the corrosive material filter (146) is shown. The dashed line around the portion of the cross section of the corrosive material filter (146) indicates that the corrosive material filter (146) continues outside of the shown portion.

The corrosive material filter (146) may include a corrosive material absorbing material (147). The corrosive material absorbing material (147) may be a material that reacts with corrosive materials. The products of these reactions may be retained in the corrosive material filter (146). For example, the reaction products may be solids. The corrosive material absorbing material (147) may include reactive metals such as, for example, aluminum, zinc, magnesium, etc.

The corrosive material filter (146) may also include airflow channels (148). Airflow channels (148) may be passages through the corrosive material filter (146). The airflow channels (148) may enable gases to pass through the corrosive material filter (146).

The corrosive material filter (146) may include a hydrophilic layer (149). The hydrophilic layer (149) may be a layer disposed on the corrosive material absorbing material (147) within the airflow channels (148). The hydrophilic layer (149) may facilitate the formation of condensation on the airflow channels (148). The condensation may improve the likelihood that corrosive materials included in gases passing through the corrosive material filter (146) react with the corrosive material absorbing material (147). For example, the corrosive materials included in the gases may be water soluble. Consequently, the presence of a layer of condensation on the surface of the corrosive material absorbing material (147) may capture corrosive materials from gases passing through the corrosive material filter (146). The captured corrosive materials may be more likely to chemically react with the corrosive material absorbing material (147) when absorbed in the water layer than when in the gases.

The hydrophilic layer (149) may include, for example, metal oxides, siloxanes, silicones, or other materials that may encourage the condensation of water vapor and/or formation of a water layer on the surface of the corrosive material absorbing material (147).

In one or more embodiments of the invention, the corrosive material filter (146) is formed from a block of metal foam. The metal foam may be an open celled foam. The metal form may include aluminum or another material or element that may react with corrosive materials.

While the corrosive material filter (146) is illustrated in FIG. 1.4 as including a specific number of specific components, a corrosive material filter (146) in accordance with embodiments of the invention may include additional, different, and/or fewer components without departing from the invention.

To further clarify embodiments of corrosive material filters (146), FIG. 1.5 shows a diagram of a surface of a corrosive material filter in accordance with one or more embodiments of the invention. In FIG. 1.5, dashed lines are used to indicate that the corrosive material filter may continue in extent beyond the boundaries delineated by the dashed lines.

As discussed above, a corrosive material filter may include a corrosive material absorbing material (147) that filters corrosive materials from an airflow (162) flowing through one or more airflow channels (e.g., 160) of the corrosive material filter. To filter the corrosive materials, the corrosive material absorbing material (147) may chemically react with corrosive material (164) as it traverses through an airflow channel (160).

Corrosion (170) may be formed when the corrosive material (164) reacts with the corrosive material absorbing material (147). The corrosion (170) may be a product of the chemical reaction between the corrosive material (164) and the corrosive material absorbing material (147). The corrosion (170) may be a solid in contrast to the gaseous form (or otherwise entrained in the airflow through another mechanism) of the corrosive material (164) included in the airflow (162).

By forming corrosion (170), the quantity of corrosive material (164) may be reduced as it passes through the corrosive material filter. For example, as illustrated in FIG. 1.5, as the airflow passes from left to right along the page, the occurrence of corrosive material (164) within the airflow decreases because the corrosive material (164) is likely to react with different portions of the corrosive material absorbing material (147). Consequently, the amount of corrosive material (164) included in the airflow (162) may be reduced by passing through the corrosive material filter.

To improve the likelihood of forming the corrosion (170), the corrosive material filter may include a hydrophilic layer (149). The hydrophilic layer (149) may be disposed on the corrosive material absorbing material (147) and facilitate formation of a condensed water layer (168).

The condensed water layer (168) may improve the likelihood that corrosive material (164) reacts with the corrosive material absorbing material (147). For example, the condensed water layer (168) may absorb corrosive material (164) from the airflow (162). Absorbing the corrosive material (164) may place the corrosive material in proximity with the corrosive material absorbing material (147) thereby increasing the likelihood that corrosion (170) will be generated. By improving the likelihood of forming the corrosion (170), the likelihood of removing the corrosive material (164) may be improved. Consequently, the thickness of the corrosive material filter may be reduced because it is more likely to, per unit length, capture the corrosive material (164) from the airflow (162).

While the hydrophilic layer and corrosion are illustrated as continuous layers, these structures may only cover portions of the surface of the corrosive material absorbing material (147). Similarly, the condensed water layer (168) may only cover portions of the corrosive material absorbing material (147).

Returning to FIG. 1.3, an information handling system may include environmental managers. FIG. 2 shows a diagram of an environmental manager (200) in accordance with one or more embodiments of the invention. The system environmental manager (130) and/or chassis environmental manager (150) illustrated in FIGS. 1.2 and 1.3, respectively, may be similar to the environmental manager (200).

As discussed above, the environmental manager (200) may provide environmental management services. Environmental management services may reduce the likelihood that IHSs fail prematurely (e.g., prior to meeting service life goals) due to corrosion.

In one or more embodiments of the invention, the environmental manager (200) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the environmental manager (200) described through this application and all, or a portion, of the method illustrated in FIG. 3. The environmental manager (200) may be implemented using other types of computing devices without departing from the invention. For additional details regarding computing devices, refer to FIG. 4.

In one or more embodiments of the invention, the environmental manager (200) is implemented using distributed computing devices. As used herein, a distributed computing device refers to functionality provided by a logical device that utilizes the computing resources of one or more separate and/or distinct computing devices. For example, in one or more embodiments of the invention, the environmental manager (200) is implemented using distributed devices that include components distributed across any number of separate and/or distinct computing devices. In such a scenario, the functionality of the environmental manager (200) may be performed by multiple, different computing devices without departing from the invention.

To provide environmental management services, the environmental manager (200) may include an environmental component manager (202) and a storage (204). Each of these components is discussed below.

The environmental component manager (202) may manage corrosive material filters and/or environmental control components that may be used to control the characteristics (e.g., temperature, humidity level, airflow rates, quantities of corrosive materials included in gases used for thermal management purposes, etc.) of the environment within a chassis. To manage them, the environmental component manager (202) may (i) obtain information regarding the environmental conditions including temperatures, humidity levels, airflow rates, and/or corrosion rates, (ii) determine, using the environmental information, whether the IHS is likely to prematurely fail due to corrosion due to these conditions, (iii) if the IHS is likely to fail, modify the environmental conditions to reduce corrosion by initiating replacement of corrosive material filters and/or modifying the operation of environmental control components, and/or (iv) if the IHS is unlikely to fail, modify the operation of environmental control components to reduce energy consumption used to condition gases for thermal management purposes (e.g., at the cost of potentially increased rates of corrosion).

To obtain information regarding the environmental conditions, the environmental component manager (202) may request such information from computing components (e.g., temperatures), detectors (e.g., corrosion, temperature, humidity, and/or other types of sensors), and/or other types of devices (e.g., components external to the chassis). In response, the aforementioned components may provide the requested information to the environmental component manager (202). The environmental component manager (202) may store the aforementioned information as part of an environmental condition repository (208).

To ascertain whether an IHS is likely to prematurely fail due to corrosion, the environmental component manager (202) may estimate a total amount of corrosion of different portions of a chassis and/or components disposed within a chassis that has likely occurred, estimate the rate that corrosion will occur in the future, and use the previous amount and current rate to determine whether corrosion management components are able to continue to provide corrosion management services sufficient to meet the service life goals of the IHS.

To generate the estimates, the environmental component manager (202) take into account the historical environmental conditions. For example, the environmental component manager (202) may use predictive models to estimate future corrosion of components based on historical rates of corrosion.

Utilizing these estimates, the environmental component manager (202) may determine whether the IHS is unlikely to meet its service life goal due to corrosion. To make this determination, the environmental component manager (202)

may utilize a lifecycle repository (212). The lifecycle repository (212) may specify information that may be used to ascertain whether a premature failure will occur based on corrosion.

For example, the lifecycle repository (212) may specify a total amount of corrosion that will cause various components (e.g., computing components, corrosive material filters) to no longer be able to provide their respective functionalities. Based on these corrosion amounts and the corrosion estimates, the environmental component manager (202) may ascertain whether the any of these components will be unlikely to provide their functionalities prior to the IHS meeting its service life goals.

If it is determined that the IHS will prematurely fail due to corrosion, the environmental component manager (202) may orchestrate replacement of one or more corrosive material filters. For example, the environmental component manager (202) may notify an administrator that a corrosive material filter needs to be removed. The environmental components manager (202) may do so by sending an electronic message to an account associated with the administrator. In response, the administrator may replace the corrosive material filter with a new corrosive material filter. Consequently, the new corrosive material filter may reduce the rates of corrosion by removing corrosive materials from the internal environments of chassis.

When providing its functionality, the environmental component manager (202) may utilize the storage (204) by storing and using previously stored data structures.

To provide the above noted functionality of the environmental component manager (202), the environmental component manager (202) may perform all, or a portion, of the method illustrated in FIG. 3.

In one or more embodiments of the invention, the environmental component manager (202) is implemented using a hardware device including circuitry. The environmental component manager (202) may be implemented using, for example, a digital signal processor, a field programmable gate array, or an application specific integrated circuit. The environmental component manager (202) may be implemented using other types of hardware devices without departing from the invention.

In one or more embodiments of the invention, the environmental component manager (202) is implemented using computing code stored on a persistent storage that when executed by a processor performs all, or a portion, of the functionality of the environmental component manager (202). The processor may be a hardware processor including circuitry such as, for example, a central processing unit or a microcontroller. The processor may be other types of hardware devices for processing digital information without departing from the invention.

In one or more embodiments disclosed herein, the storage (204) is implemented using devices that provide data storage services (e.g., storing data and providing copies of previously stored data). The devices that provide data storage services may include hardware devices and/or logical devices. For example, storage (204) may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage (204) may include a memory device (e.g., a dual in line memory device) in which data is stored and from which copies of previously stored data are provided. In another example, storage (204) may include a persistent storage device (e.g., a solid state disk drive) in which data is stored and from which copies of previously stored data are provided. In a still further example, storage (204) may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

The storage (204) may store data structures including an environmental condition repository (208), a corrosion rate repository (210), and a lifecycle repository (212). Each of these data structures is discussed below.

The environmental condition repository (208) may include one or more data structures that include information regarding the environmental conditions associated with a chassis, corrosive material filter, and/or another type of component (e.g., a computing component). For example, when temperature, humidity, airflow rate, and/or corrosion data is read from a detector, the read information may be stored in the environmental condition repository (208). Consequently, a historical record of the environmental conditions associated with these components may be maintained.

The environmental condition repository (208) may include any type and quantity of information regarding the environmental conditions associated with these components. For example, the environmental condition repository (208) may include temperature sensor data from discrete temperature sensors and/or temperature sensors integrated into computing components (and/or other types of devices). In another example, the environmental condition repository (208) may include corrosion rates obtained from discrete or integrated corrosion sensors (e.g., on board a circuit card). In a still further example, the environmental condition repository (208) may include airflow rate data regarding the flow of gases within a chassis.

In addition to the sensor data, the environmental condition repository (208) may include spatial data regarding the relative locations of these components with respect to the locations of the detectors. For example, some of these components may be disposed away from the detectors. Consequently, it may not be possible to directly measure the temperature, relative humidity level, airflow rates, and/or corrosion of these components. The spatial data may be used to estimate, using measured temperatures and/or corrosion, the likely corrosion rates of these components.

The corrosion rate repository (210) may include one or more data structures that include information regarding the rates at which various components have corroded. For example, the corrosion rate repository (210) may include tables associated with corrosive material filters, chassis, and/or other types of components disposed in chassis. Each of these tables may include the measured and/or estimated corrosion of these components.

The tables may also include the time at which the corrosion was measured. Consequently, the rates of corrosion of these components may be ascertained using the information included in the tables (e.g., corrosion at time T1—corrosion at time T2/the different between T1 and T2).

The lifecycle repository (212) may include one or more data structures that include information regarding the desired life of an information handling system. For example, the lifecycle repository (212) may specify how much corrosion may occur with respect to different components (e.g., portions of a chassis, corrosive material filters, computing components, etc.) before the respective components are likely to fail and/or the IHS is likely to fail due to downstream impacts of corrosion. The aforementioned information may be used in conjunction with determined corrosion rates and quantities of corrosion included in the corrosion rate repository (210) to determine whether it is likely that a component, computing device, and/or IHS is likely to fail prior to its desired service life.

While the data structures stored in storage (204) have been described as including a limited amount of specific information, any of the data structures stored in storage (204) may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, table, linked lists, databases, or any other type of data structures usable for storage of the aforementioned information.

While the environmental manager (200) of FIG. 2 has been described and illustrated as including a limited number of specific components for the sake of brevity, an environmental manager in accordance with embodiments of the invention may include additional, fewer, and/or different components than those illustrated in FIG. 2 without departing from the invention.

Further, any of the components may be implemented as a service spanning multiple devices. For example, multiple computing devices housed in multiple chassis may each run respective instances of the environmental component manager (202). Each of these instances may communicate and cooperate to provide the functionality of the environmental component manager (202).

As discussed above with respect to FIG. 2, the environmental manager (200) may provide corrosion management services. FIG. 3 illustrates a method that may be performed by the environmental manager (200) of FIG. 2 when providing corrosion management services.

FIG. 3 shows a flowchart of a method in accordance with one or more embodiments of the invention. The method depicted in FIG. 3 may be used to manage corrosion in accordance with one or more embodiments of the invention. The method shown in FIG. 3 may be performed by, for example, an environmental manager (e.g., 200, FIG. 2). Other components of the system illustrated in FIGS. 1.1-2 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, corrosion states of a corrosive material filter and a computing component are monitored. The corrosion states may be monitored using detectors. The detectors may measure the corrosion of these components directly (e.g., using a corrosion detector) or indirectly (e.g., using relative humidity and temperature detectors to estimate rates of corrosion).

The corrosion state of the corrosive material filter may indicate whether it is capable of continuing to filter corrosive materials from gases used for thermal management purposes. As noted above, the corrosive material filter may only be capable of filtering a finite amount of corrosive material from gases. Consequently, it may be unable to continue providing its functionality after it has absorbed a quantity of corrosive material exceeding a predetermined threshold.

To monitor the corrosion state of the corrosive material filter, detectors downstream (e.g., in an airflow path) of the corrosive material filter may be utilized. These filters may measure rates of corrosion. If the rates of corrosion increases, it may indicate that the corrosive material filter is unable to continue to filter corrosive materials. Consequently, the corrosion state of the corrosive material filter may be unacceptable if the rate of corrosion downstream from it increases beyond a predetermined threshold.

The corrosion state of the computing component may indicate whether it is likely to fail due to corrosion prior to it meeting its service life goals. To make the determination, a predictive model may be utilized. Past rates of corrosion of the computing component and/or environmental conditions associated with the computing component may be used to train the predictive model. The predict model may be, for example, a machine learning algorithm, regression technique, or other method of predicting future behavior based on past performance.

Once trained, the predictive model may be used to estimate the future levels of corrosion of the computing component. These future corrosion levels may be compared to a level specified in a lifecycle repository that is associated with a failure of the computing component to estimate when the computing component will likely fail. If the predicted point in time in the future at which the computing component will fail occurs prior to the computing component meeting its service life goals, the corrosion state of the component may be determined as being unacceptable.

In step 302, it is determined whether the corrosive material filter should be replaced based on one or more of the corrosion states monitored in step 300.

The determination may be made based on whether the aforementioned states are acceptable. In other words, if the corrosion state of the corrosive material filter is unacceptable, it may be determined that the corrosive material filter should be replaced.

Similarly, if the corrosion state of a component (e.g., computing component) is unacceptable, it may be determined that the corrosive material filter should be replaced.

If it is determined that the corrosive material filter should be replaced, the method may proceed to step 304. If it is determined that the corrosive material filter should not be replaced, the method may end following step 302.

In step 304, the corrosive material filter is scheduled for replacement. The corrosive material filter may be scheduled for replacement by notifying an administrator that the corrosive material filter should be replaced. The administrator may be notified by sending an electronic message to an account associated with the administrator. The message may specify that the corrosive material filter should be replaced.

The method may end following step 304.

If it is determined that the corrosion state of the computing component is acceptable in step 302, changes to the operation of environment control components may be made in a manner that minimizes the consumption of power for gas conditioning purposes. By doing so, the energy consumed for managing corrosion may be reduced when corrosive material filters are able to manage corrosion of components disposed in a chassis.

Figure 4:
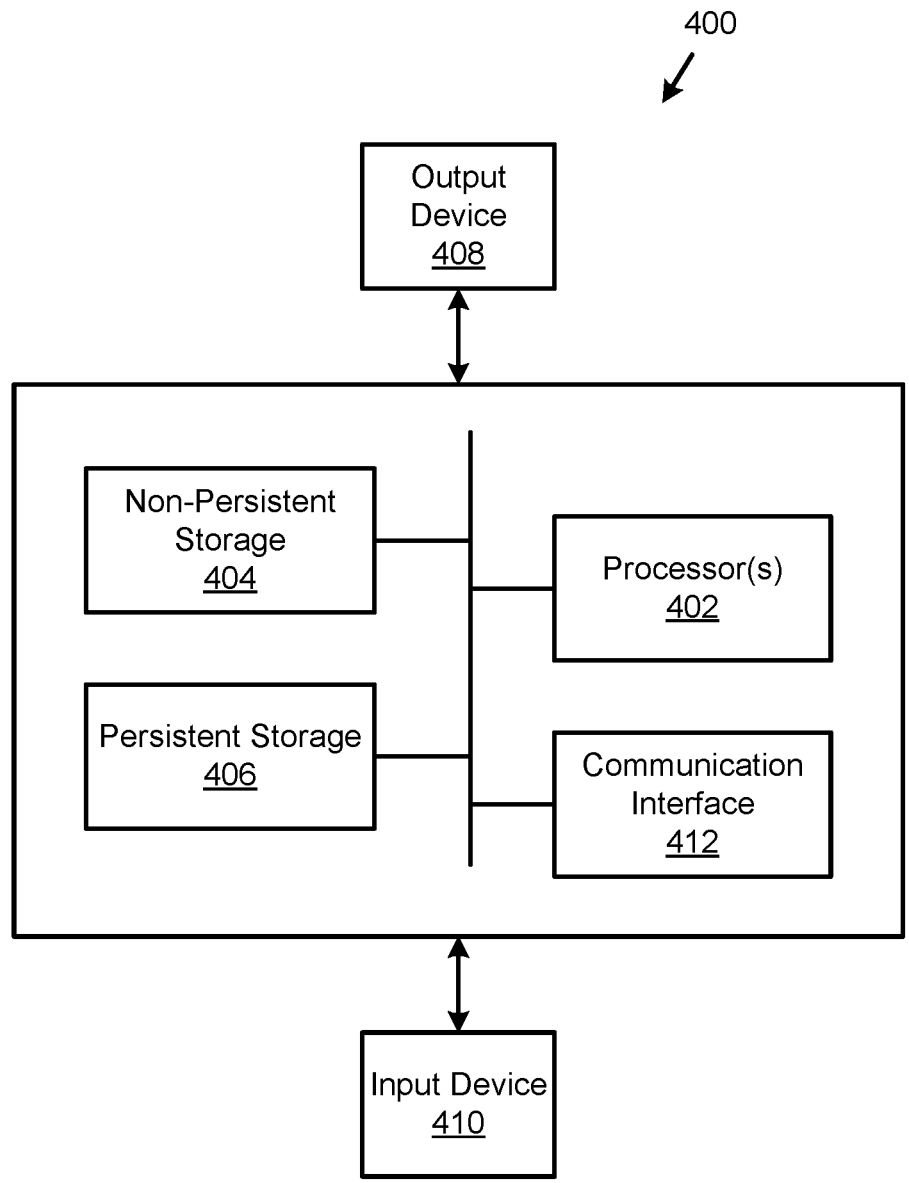
FIG. 4 shows a diagram of a computing device in accordance with one or more embodiments of the invention.

Embodiments of the invention may be implemented using a computing device. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide an improved method for managing components of an information handling system. Specifically, embodiments of the invention may provide a method and device for managing corrosion that may cause components of an information handling system to fail. To do so, embodiments of the invention may provide a system that includes a corrosive material filter. The corrosive material filter may filter out materials from gases used for thermal management purposes. By doing so, corrosion of components thermally managed using the gases may be reduced by reducing exposure to corrosive materials.

Thus, embodiments of the invention may address the problem of environments that may cause undesired corrosion. Specifically, embodiments of the invention may provide a method of managing corrosion that enables less power to be consumed for environmental conditioning purposes while still mitigating the impacts of corrosion.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A chassis of an information handling system, comprising:
   a computing component that is sensitive to corrosive materials and thermally managed by an airflow;
   a corrosive material filter adapted to extract the corrosive materials from the airflow that thermally manages the computing component,
      wherein the corrosive material filter is disposed at an entrance of the chassis in which the computing components is disposed and through which the airflow traverses,
      wherein the corrosive material filter is adapted to condense a portion of water vapor in the airflow onto a hydrophilic surface of the corrosive material filter to generate a corrosive material absorptive layer, and
      wherein the corrosive material absorptive layer is adapted to absorb corrosive materials and chemically react with the corrosive materials,
      wherein the corrosive material filter comprises a metal foam and the hydrophilic surface is disposed on the metal foam, and
      wherein the hydrophilic surface comprises siloxanes or silicones and is disposed in an airflow channel of the corrosive material filter;
   a corrosion detector configured to monitor corrosion is disposed downstream from the corrosive material filter along a path of the airflow; and
   an environmental manager programmed to:
      monitor a corrosion state of the corrosive material filter by receiving corrosion data from the corrosion detector;
      make a determination that the corrosion material filter should be replaced based on the corrosion state; and
      schedule replacement of the corrosive material filter based on the determination.

2. The chassis of claim 1, wherein the corrosive material filter comprises:
   a plurality of airflow channels through the corrosive material absorbing material adapted to enable the airflow to flow through the chassis.

3. The chassis of claim 1, wherein the metal foam is an open cell foam.

4. The chassis of claim 3, wherein the metal foam is an aluminum foam.

5. The chassis of claim 1, wherein the metal foam is chemically reactive with chlorinated compounds.

* * * * *